(12) United States Patent
Yang et al.

(10) Patent No.: US 11,028,266 B2
(45) Date of Patent: Jun. 8, 2021

(54) CURABLE ORGANOPOLYSILOXANE COMPOSITION, ENCAPSULANT AND SEMICONDUCTOR DEVICE

(71) Applicant: Wacker Chemie AG, Munich (DE)

(72) Inventors: Hyun-Kwan Yang, Yongin-si (KR); Young-Hyuk Joo, Suwon-si (KR); Young-Jin Kim, Suwon-si (KR); Arvid Kuhn, Burghausen (DE)

(73) Assignee: WACKER CHEMIE AG, Munich (DE)

( * ) Notice: Subject to any disclaimer, the term of this patent is extended or adjusted under 35 U.S.C. 154(b) by 47 days.

(21) Appl. No.: 16/322,415

(22) PCT Filed: Aug. 12, 2016

(86) PCT No.: PCT/EP2016/069244
§ 371 (c)(1),
(2) Date: Jan. 31, 2019

(87) PCT Pub. No.: WO2018/028792
PCT Pub. Date: Feb. 15, 2018

(65) Prior Publication Data
US 2019/0194458 A1    Jun. 27, 2019

(51) Int. Cl.
| | | |
|---|---|---|
| C08G 77/00 | (2006.01) | |
| C08L 83/04 | (2006.01) | |
| C09J 183/04 | (2006.01) | |
| C08K 5/5415 | (2006.01) | |
| H01L 23/31 | (2006.01) | |
| C08K 5/5425 | (2006.01) | |
| C09D 183/04 | (2006.01) | |
| C08G 77/08 | (2006.01) | |
| C08K 5/00 | (2006.01) | |
| H01L 33/56 | (2010.01) | |
| C08K 9/00 | (2006.01) | |
| C08G 77/20 | (2006.01) | |
| C08G 77/12 | (2006.01) | |
| C09D 7/40 | (2018.01) | |

(52) U.S. Cl.
CPC .............. *C08L 83/04* (2013.01); *C08G 77/08* (2013.01); *C08G 77/70* (2013.01); *C08K 5/0025* (2013.01); *C08K 5/5415* (2013.01); *C08K 5/5425* (2013.01); *C09D 183/04* (2013.01); *C09J 183/04* (2013.01); *H01L 23/31* (2013.01); *C08G 77/12* (2013.01); *C08G 77/20* (2013.01); *C08G 77/80* (2013.01); *C08K 9/00* (2013.01); *C08L 2203/206* (2013.01); *C08L 2312/00* (2013.01); *C09D 7/40* (2018.01); *H01L 33/56* (2013.01)

(58) Field of Classification Search
CPC ........ C08G 77/12; C08G 77/20; C08G 77/80; C08G 77/70; H01L 33/56
See application file for complete search history.

(56) References Cited

U.S. PATENT DOCUMENTS

| | | | |
|---|---|---|---|
| 7,527,871 B2 | 5/2009 | Morita et al. | |
| 8,258,502 B2 | 9/2012 | Yoshitake et al. | |
| 9,306,133 B2 | 4/2016 | Hamamoto et al. | |
| 2002/0111426 A1* | 8/2002 | Dietl .................... | C08K 5/544 524/858 |
| 2006/0073347 A1 | 4/2006 | Morita et al. | |
| 2007/0244230 A1* | 10/2007 | Sixt ...................... | C08L 83/04 524/128 |
| 2008/0006179 A1* | 1/2008 | Mueller ............... | C09D 183/04 106/287.14 |
| 2013/0113008 A1* | 5/2013 | Shiobara ............. | C09K 11/7721 257/98 |
| 2014/0367723 A1 | 12/2014 | Yamazaki et al. | |
| 2015/0001569 A1 | 1/2015 | Yoshitake et al. | |
| 2016/0347911 A1 | 12/2016 | Hayashi et al. | |

FOREIGN PATENT DOCUMENTS

| | | |
|---|---|---|
| EP | 2857457 A1 | 4/2015 |
| EP | 2756027 B1 | 7/2015 |
| EP | 2896658 A1 | 7/2015 |
| EP | 3103842 A1 | 12/2016 |
| JP | 2004143361 A2 | 5/2004 |
| JP | 2012233153 A | 11/2012 |
| JP | 2013076050 A | 4/2013 |
| JP | 2013159670 A | 8/2013 |
| JP | 2013159671 A | 8/2013 |
| TW | 201533164 A | 1/2015 |
| WO | 2013176238 A1 | 11/2013 |
| WO | 2015030259 * | 3/2015 |
| WO | 2015030259 A1 | 3/2015 |
| WO | 2015119226 A1 | 8/2015 |

* cited by examiner

*Primary Examiner* — Kuo Liang Peng
(74) *Attorney, Agent, or Firm* — Brooks Kushman P.C.

(57) ABSTRACT

A curable organopolysiloxane composition, a Light Emitting Diode (LED) encapsulant and a semiconductor device, employ a curable organopolysiloxane composition containing a branched organopolysiloxane bearing alkenyl groups and aryl groups, a linear organopolysiloxnae bearing terminal Si—H functionality, and a low molecular weight component having at least one alkenyl group. As an encapsulant, the composition displays improved stability.

13 Claims, 6 Drawing Sheets

CURABLE ORGANOPOLYSILOXANE COMPOSITION, ENCAPSULANT AND SEMICONDUCTOR DEVICE

CROSS REFERENCE TO RELATED APPLICATIONS

This application is the U.S. National Phase of PCT Appln. No. PCT/EP2016/069244 filed Aug. 12, 2016, the disclosure of which is incorporated in its entirety by reference herein.

BACKGROUND OF THE INVENTION

1. Field of the Invention

The present invention relates to a curable organopolysiloxane composition, a Light Emitting Diode (LED) encapsulant and a semiconductor device. More specifically, the present invention relates to a curable organopolysiloxane composition with excellent toughness, flexibility, and resistance to light and heat, a Light Emitting Diode (LED) encapsulant and a semiconductor device of superior reliability.

2. Description of the Related Art

A LED package is generally composed of a chip, an adhesive, an encapsulant, a phosphor, and a heat radiation material. Among them, the encapsulant basically serves to protect a LED device, and allows light to pass through the LED device and emit light outside the device.

As a basic material for the LED encapsulant, curable silicone compositions and curable epoxy compositions have been used. Particularly, silicone compositions curable by a hydrosilylation reaction, which gives optically clear silicone products, have been mainly used for good properties such as resistance to heat, moisture, and light.

Recently, as high power output has been demanded in the field of LEDs, such high power output of LEDs has caused problems with LED package materials due to their lack of thermal resistance. Lack of robust thermal resistance in the packaging can cause changes in optical properties (e.g., color) and in mechanical properties such as hardness. Thus, the consistency of mechanical properties is highly desirable.

Furthermore, contaminants in air may penetrate the LED encapsulant, which reduces efficiency and can affect the integrity of the semiconductor materials contained therein. It may reduce brightness of the LED.

U.S. Pat. No. 7,527,871 discloses a curable organopolysiloxane composition comprising (A) a linear organopolysiloxane having at least two alkenyl groups and at least one aryl group, (B) a branched organopolysiloxane, having at least one alkenyl group and aryl group, (C) a linear organopolysiloxane, with terminal Si—H, containing at least one aryl group, and (D) a hydrosilylation reaction catalyst.

U.S. Pat. No. 8,258,502 teaches a composition comprising (I) an alkenyl-functional phenyl-containing polyorganosiloxane, (II) a hydrogendiorganosiloxy-terminated oligo-diphenylsiloxane, and (III) a hydrosilylation catalyst.

U.S. Pat. No. 9,306,133 also discloses a curing silicone resin composition for an optical semiconductor device, comprising: (A) an aryl group and an alkenyl group-containing organopolysiloxane; (B) organohydrogenpolysiloxane having at least two hydrosilyl groups (SiH groups) per molecule and also having an aryl group, in a constituent unit having an amount that a molar ratio of the hydrosilyl group in the component (B) with respect to the alkenyl group in the component (A) (SiH group/alkenyl group) is 0.70 to 1.00; and (C) a hydrosilylation catalyst.

Unfortunately, the problems still remain in that these curable organopolysiloxane compositions do not exhibit satisfactory toughness, flexibility, and resistance to light and heat. Materials described in the prior art often show an increase in hardness after curing during storage at high temperature. Due to the change in hardness and weight loss, the materials are not stable under normal operating conditions. Therefore, there is a need for formulations that lead to materials that show better stabilities, in e.g., hardness and weight loss, at high temperatures.

SUMMARY OF THE INVENTION

It is an object of the present invention to provide a curable organopolysiloxane composition with excellent toughness, flexibility, and resistance to light and heat, an LED encapsulant and a semiconductor device of superior reliability. These and other objects are accomplished through use of a curable organopolysiloxane composition of the present invention comprises:

(A) a branched organopolysiloxane having at least one silicon-bonded alkenyl group and at least one silicon-bonded aryl group per molecule, and having siloxane units represented by the general formula: $RSiO_{3/2}$ where R is a substituted or unsubstituted monovalent hydrocarbon group;

(B) a linear organopolysiloxane with both terminal ends of the molecular chain blocked by silicon-bonded hydrogen atoms and having at least one silicon-bonded aryl group per molecule;

(C) a hydrosilylation reaction catalyst; and (D) a low molecular weight siloxane having at least one silicon-bonded alkenyl group per molecule, represented by the average formula

DETAILED DESCRIPTION OF THE PREFERRED EMBODIMENT

The curable organopolysiloxane composition of the present invention comprises:

(A) a branched organopolysiloxane having at least one silicon-bonded alkenyl group and at least one silicon-bonded aryl group per molecule, and having siloxane units represented by the general formula: $RSiO_{3/2}$ where R is a substituted or unsubstituted monovalent hydrocarbon group;

(B) a linear organopolysiloxane with both terminal ends of the molecular chain blocked by silicon-bonded hydrogen atoms and having at least one silicon-bonded aryl group per molecule;

(C) a hydrosilylation reaction catalyst; and (D) a low molecular weight siloxane having at least one silicon-bonded alkenyl group per molecule, represented by the average formula where each $R^5$ can be the same or different and is independently selected from a substituted or unsubstituted monovalent hydrocarbon group, wherein at least one of $R^5$ per molecule is an alkenyl group, with the proviso that the ratio between alkenyl groups and silicon atoms is from 0.3 to 1 (as determined by $^{29}$Si NMR spectroscopy), f, g, h, and i are independently 0 or positive, and the weight average molecular weight Mw of the siloxane is less than 1,000 g/mol (as measured by SEC, THF as solvent, in a concentration of 5 mg/mL, RI detector against polystyrene as standard).

In addition, the LED encapsulant of the present invention comprises the above-described curable organopolysiloxane composition.

Furthermore, the semiconductor device of the present invention comprises semiconductor elements that are coated with a cured product of the above-described curable organopolysiloxane composition.

The curable organopolysiloxane composition of the present invention cures to a cured product that exhibits excellent toughness and flexibility. In addition, the composition of the present invention cures to a cured product that shows stability against sulfur, low weight change, low hardness change, and low discoloration at high temperature. Thus, according to the present invention, a LED silicone encapsulant with a stability to light generated from the LED chip and heat generated in operation is provided. In addition, the product provides lower transmittance to steam and oxygen than conventional silicone, which is helpful for reduction of discoloration of the substrate of LED package due to sulfur transfer. According to the present invention, high hardness and flexibility at high temperature may be kept and as a result, the reliability of LED devices is increased.

Hereinafter, an exemplary embodiment of the present invention will be described in detail. However, the exemplary embodiment of the present invention may be modified in various forms, and the scope of the present invention is not limited to an exemplary embodiment to be described below.

The present invention provides a curable organopolysiloxane composition comprising:

(A) a branched organopolysiloxane having at least one silicon-bonded alkenyl group and at least one silicon-bonded aryl group per molecule, and having siloxane units represented by the general formula: $RSiO_{3/2}$ where R is a substituted or unsubstituted monovalent hydrocarbon group;

(B) a linear organopolysiloxane with both terminal ends of the molecular chain having silicon-bonded hydrogen atoms and having at least one silicon-bonded aryl group per molecule;

(C) a hydrosilylation reaction catalyst; and (D) a low molecular weight siloxane having at least one silicon-bonded alkenyl group, represented by the average formula where each $R^5$ can be the same or different and is independently selected from a substituted or unsubstituted monovalent hydrocarbon group, wherein at least one of $R^5$ per molecule is an alkenyl group, with the proviso that the ratio between alkenyl groups and silicon atoms is from 0.3 to 1, f, g, h, and i are independently 0 or positive, and the weight average molecular weight Mw of the siloxane is less than 1,000 g/mol.

Component (A)

Component (A), which is the major component of the composition according to the present composition, is used to impart strength to the cured product obtained by curing the composition.

Component (A) represents a branched organopolysiloxane having at least one silicon-bonded alkenyl group and at least one silicon-bonded aryl group per molecule, and having siloxane units represented by the general formula: $RSiO_{3/2}$ where R is a substituted or unsubstituted monovalent hydrocarbon group.

In component (A), examples of the alkenyl groups include vinyl, allyl, methallyl, butenyl, pentenyl, and hexenyl groups, preferably vinyl and allyl groups, most preferably the vinyl group.

In component (A), examples of the aryl groups include phenyl, naphthyl, anthryl, phenanthryl, indenyl, benzophenyl, fluorenyl, xanthenyl, anthronyl; aryloxyaryl groups such as o- or p-phenoxyphenyl; alkaryl groups such as o-, m-, p-tolyl, xylyl and ethylphenyl; aralkyl groups such as benzyl, α- and β-phenylethyl. Preferably the aryl group is the phenyl group.

In addition, examples of silicon-bonded organic groups of component (A) other than the alkenyl and aryl groups include substituted or unsubstituted monovalent hydrocarbon groups, examples of which include methyl, ethyl, propyl, butyl, pentyl, hexyl, heptyl, and other alkyl groups; and halogenated alkyl groups such as chloromethyl, 3-chloropropyl, and 3,3,3-trifluoropropyl, with methyl being most preferred.

In the siloxane units of component (A) represented by the general formula $RSiO_{3/2}$, R is a substituted or unsubstituted monovalent hydrocarbon group. Substituents of hydrocarbon groups may include the above-mentioned alkyl groups, the above-mentioned alkenyl groups, the above-mentioned aryl groups, the above-mentioned aralkyl groups, and the above-mentioned halogenated alkyl groups, most preferably the above-mentioned alkyl groups and the above-mentioned aryl groups.

As component (A), an organopolysiloxane represented by the average unit formula:

is preferable.

In the formula above, each of $R^1$, $R^2$, and $R^3$ can be the same or different and is independently selected from a substituted or unsubstituted monovalent hydrocarbon group, wherein at least one of $R^1$, $R^2$ or $R^3$ per molecule is an alkenyl group and at least one of $R^1$, $R^2$ or $R^3$ per molecule is an aryl group.

The monovalent hydrocarbon group may be more specifically exemplified by the above-mentioned alkyl groups, the above-mentioned alkenyl groups, the above-mentioned aryl groups, the above-mentioned aralkyl groups, and the above-mentioned halogenated alkyl groups.

Preferably 0.1 to 40 mol %, more preferably 5 to 25 mol %, of $R^1$, $R^2$, and $R^3$ per molecule are alkenyl groups. This is due to the fact that when the content of the alkenyl groups is below the lower limit or exceeds the upper limit of the above-mentioned range, its reactivity tends to decrease.

Also, in order to achieve low attenuation due to light refraction, reflection, scattering etc. in the cured product obtained by curing preferably not less than 10 mol % of $R^1$, $R^2$, and $R^3$ should be aryl groups, and, in particular, in siloxane units represented by the general formula $R^2SiO_{3/2}$, it is even more preferable that not less than 30 mol % of $R^2$ should be represented by aryl groups, with $R^2$ other than the alkenyl and aryl groups being preferably represented by methyl groups.

In addition, in the formula above,

X is a hydrogen atom or alkyl group, a is 0 or a positive number, b is 0 or a positive number, c is a positive number, d is 0 or a positive number, e is 0 or a positive number, b/c is a number between 0 and 10, a/c is a number between 0 and 0.5, d/(a+b+c+d) is a number between 0 and 0.3, and e/(a+b+c+d) is a number between 0 and 0.4.

As component (A), an organopolysiloxane with the average unit formula:

$(R^1R^1R^3SiO_{1/2})_a(R^1{}_2SiO_{2/2})_b(R^2SiO_{3/2})_c$ is particularly preferable.

In the formula above, $R^1$ is a $C_1$ to $C_{12}$ alkyl group, $R^2$ is a $C_6$ to $C_{20}$ aryl group or $C_7$ to $C_{20}$ aralkyl group, $R^3$ is $C_2$ to $C_{12}$ alkenyl group, a is 0 or a positive number, b is 0 or a positive number, and c is a positive number.

Although there are no limitations concerning the molecular weight of component (A), when measured employing polystyrene standards, its weight average molecular weight (Mw) should preferably be in the range of from 500 g/mol to 10,000 g/mol, more preferably, in the range of from 700 g/mol to 7,000 g/mol, yet more preferably in the range from 1,000 g/mol to 5,000 g/mol, and particularly from 1,500 to 3,000 g/mol.

Component (A) is preferably present in an amount of greater than or equal to 70%, more preferably 70 to 90% by weight, and most preferably, 75 to 85% by weight, based on the sum of the amount of components (A) and (B).

Preferably, the composition of the present invention comprises 60 to 75 wt. %, more preferably 70 to 75 wt. %, of Component (A), based on the total weight of the composition.

Component (B)

Component (B) is the curing agent of the present composition.

Component (B) is a linear organopolysiloxane with both terminal ends of the molecular chain bearing silicon-bonded hydrogen atoms, and having at least one silicon-bonded aryl group per molecule. By using a linear organopolysiloxane as the curing agent instead of a branched organopolysiloxane, good elongation may be obtained.

Examples of the aryl groups of component (B) are the same as those described above for component (A). The phenyl group is especially preferable.

In addition, examples of silicon-bonded organic groups of component (B) other than aryl groups include substituted or unsubstituted monovalent hydrocarbon groups with the exception of alkenyl groups, such as the above-described alkyl groups, aralkyl groups, and halogenated alkyl groups, with methyl being particularly preferable.

In order to achieve low attenuation due to light refraction, reflection, scattering etc. in the cured product obtained by curing, the content of the silicon-bonded aryl groups among all the silicon-bonded organic groups in component (B) should preferably be not less than 15 mol % and, more preferably, not less than 30 mol %. Although there are no limitations concerning the viscosity of component (B) at 25° C., it is preferably in the range of from 1 to 1,000 mPa·s, and, more preferably, in the range of from 2 to 500 mPa·s. This is due to the fact that when the viscosity of component (B) is below the lower limit of the above-mentioned range, it may tend to volatilize and the makeup of the resultant composition may be unstable, and, on the other hand, when it exceeds the upper limit of the above-mentioned range, the handling properties of the resultant composition tend to deteriorate.

An organopolysiloxane represented by the general formula:

[Formula 2]

is preferable as component (B).

In the formula above, each $R^4$ can be the same or different and is independently selected from a hydrogen atom or a substituted or unsubstituted monovalent hydrocarbon group with the exception of alkenyl groups.

Examples of the monovalent hydrocarbon groups of $R^4$ include the above-mentioned alkyl groups, aryl groups, and halogenated alkyl groups.

Here, at least one $R^4$ per molecule must be one of the above-mentioned aryl groups, preferably, phenyl.

In addition, n in the formula above is an integer of 0 or more, preferably, an integer in the range of from 0 to 20, and, more preferably, an integer in the range of from 0 to 10. This is due to the fact that when the value of n exceeds the upper limit of the above-mentioned range, the toughness of the resultant composition, or the adhesive properties of the cured product, tend to deteriorate. It is most preferable that n is 1 to 4, particularly, 1, that is, the component (B) represents a trisiloxane.

By having a D unit as the repeating unit, instead of Q or T unit, a good elongation performance may be obtained.

Component (B) is preferably present in an amount of 1 to 30% by weight, more preferably 10 to 30% by weight, and most preferably, 15 to 25% by weight, based on the sum of the amount of components (A) and (B).

It is preferable that the molar ratio of Si—H groups in component (B)/alkenyl groups, for example, vinyl groups, in component (A) is 1 to 1.2 to reduce the reactive residual silicone hydride.

Preferably, the composition of the present invention comprises 18 to 25 wt. %, more preferably 20 to 22 wt. %, of Component (B), based on the total weight of the composition.

Component (C)

Component (C) is a hydrosilylation reaction catalyst.

The hydrosilylation reaction catalyst of component (C) is used to promote the reaction of the alkenyl groups of component (A) with the silicon-bonded hydrogen atoms of component (B).

Examples of component (C) include platinum catalysts, rhodium catalysts, and palladium catalysts. Platinum catalysts are preferable because of their ability to significantly stimulate the cure of the present composition. Examples of the platinum catalysts include platinum micropowder, chloroplatinic acid, alcohol solutions of chloroplatinic acid, platinum/alkenylsiloxane complexes, platinum/olefin complexes, and platinum/carbonyl complexes, preferably, platinum/alkenylsiloxane complexes. Examples of the alkenylsiloxanes include 1,3-divinyl-1,1,3,3-tetramethyldisiloxane, 1,3,5,7-tetramethyl-1,3,5,7-tetravinylcyclotetrasiloxane, alkenylsiloxanes obtained by substituting groups such as ethyl, phenyl etc. for some of the methyl groups of the above-mentioned alkenylsiloxanes, and alkenylsiloxanes obtained by substituting groups such as allyl, hexenyl, etc. for the vinyl groups of the above-mentioned alkenylsiloxanes. 1,3-divinyl-1,1,3,3-tetramethyldisiloxane is particularly preferable because of the excellent stability of the platinum/alkenylsiloxane complex. Also, due to the improvement in the stability of the complex that their addition may bring, it is desirable to add 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinylcyclotetrasiloxane and other alkenylsiloxanes and organosiloxane oligomers such as dimethylsiloxane oligomers to the platinum/alkenylsiloxane complex, with alkenylsiloxanes being particularly preferable.

There are no limitations on the content of component (C) as long as the amount promotes curing of the present composition. However, specifically, in the present composition, component (C) is preferably present in an amount resulting in a platinum content of 0.05 to 100 ppm (parts per million) by weight, more preferably 0.1 to 10 ppm by weight, most preferably preferred 0.1 to 5 ppm by weight, relative to 100 parts by weight of the total of components (A) and (B), calculated as elemental platinum. This is due to the fact that when the content of component (C) is below the lower limit of the above-mentioned range, the present composition tends to fail to completely cure, and, on the other hand, when it exceeds the upper limit of the above-mentioned range, problems may arise in terms imparting various colors to the resultant cured product.

Component (D)

Component (D) is an additive, which is a low molecular weight siloxane having at least one silicon-bonded alkenyl group per molecule, represented by the average formula where each $R^5$ can be the same or different and is independently selected from a substituted or unsubstituted monovalent hydrocarbon group, wherein at least one of $R^5$ per molecule is an alkenyl group, with the proviso that the ratio between alkenyl groups and silicon atoms is from 0.3 to 1, f, g, h, and i are independently 0 or positive, and the weight average molecular weight Mw of the siloxane is less than 1,000 g/mol, preferably less than 800 g/mol, and more preferably less than 500 g/mol.

Preferably component (D) is selected from the group consisting of $D^{alkenyl}_4$, $M^{alkenyl}_4Q$, $M^{alkenyl}_6Q_2$, $M^{alkenyl}_3T$. Preferably the alkenyl group is vinyl. Most preferred as component (D) are cyclotetrasiloxane $D^{Vi}_4$, and $M^{Vi}_4Q$, especially $D^{Vi}_4$.

It is assumed that component (D) serves to react with an unreacted site (Si—H), thereby protecting additional reaction of the unreacted site due to heat or light. As a result, in the composition comprising component (D), color change and mechanical strength change to high temperature may be remarkably reduced.

In the compositions according to prior art, which have no component (D), materials often show an increase in hardness after curing during storage at high temperature, which can be attributed to a post-curing reaction of remaining reactive sites and/or show a weight loss by evaporation of low molecular weight species that did not crosslink into the polymer network. Due to the change in hardness and weight loss, the materials were not stable under operating conditions. In the present invention, a reaction of component (D) with unreacted site (Si—H) leads to better stability such as less change in hardness, low weight loss, and discoloration, at high temperature.

Component (D) also gives a filling effect, which makes it possible to lower gas and vapor transmission. The encapsulant further comprising component (D) provides stability to sulfur and such effect is expected to be obtained from the filing effect.

As a result, an LED package with excellent reliability may be obtained.

Component (D) is both reactive enough and small enough to react with residual silicone hydride. At the same time, component (D) crosslinks into the siloxane network and thus does not increase the proportion of volatile components in the cured material. Component (D) is preferably used in an amount of at most 10 parts by weight, more preferably at most 7 parts by weight, and even more preferably at most 5 parts by weight relative to 100 parts by weight of the total of components (A) and (B). If component (D) is included in higher amounts, compatibility with the other components would be lower and thus, transmittance would be lower. Preferably, component (D) is used in an amount of at least 1 parts by weight relative to 100 parts by weight of the total of components (A) and (B). The amount of the component (D) may be adequately selected in consideration of the specific formulation and features.

Preferably, the composition of the present invention comprises 1 to 5 wt. %, more preferably 2 to 4 wt. %, of Component (D), based on the total weight of the composition. The curable silicone composition of the present invention may not comprise as flexibilizing units, a linear organopolysiloxane having at least two silicon-bonded alkenyl groups and at least one silicon-bonded aryl group per molecule. It is assumed that since bulky branched organopolysiloxane such as component (A) is used instead of a linear organopolysiloxane, the present curable silicone composition provides excellent hardness and toughness. That is, a bulky branched organopolysiloxane is directly connected to unreacted Si—H site.

The curable organopolysiloxane composition of the present invention may further comprise a crosslinking agent, which is generally used in this field.

The curable organopolysiloxane composition of the present invention may further comprise a curing inhibitor, a catalyst, and a phosphor, which are generally used in this field.

The present composition may also contain silica, glass, quartz, cristobalit, alumina, zinc oxide and other inorganic fillers; micropowders of organic resins such as polymethacrylate resin; heat-stabilizers, dyes, pigments, flame retardants, solvents, etc. as optional components, so long as this does not impair the purpose of this invention.

The compositions described above may be prepared by mixing the components generally used in this art, for example, by mixing all the components at ambient temperature.

An LED encapsulant of the present invention comprises the curable organopolysiloxane composition as described above. Encapsulation for light emitting devices in the present invention is well known to the art and may be used in the present invention. For example, casting, dispensing, molding may be used.

In a semiconductor device of the present invention, semiconductor elements are coated with a cured product of the curable organopolysiloxane composition as described above. Such semiconductor elements are exemplified by semiconductor elements used in diodes, transistors, thyristors, solid-state image pickup elements, monolithic ICs and in hydride ICs. In particular, it is preferable that semiconductor elements are light-emitting elements.

Examples of such semiconductor devices included diodes, light-emitting diodes, transistors, thyristors, photocouplers, CCDs, monolithic IICs, hybrid ICs, LSIs, and VLSIs.

EXAMPLES

Analytical Methods
Description of $^{29}$Si-NMR Measurement:
Solvent: $C_6D_6$ 99.8% d/CCl$_4$ 1:1 v/v with 1 w/w Cr(acac)$_3$ as reagent for relaxation
Sample concentration: ca. 2 g/1.5 mL solvent in 10 mm NMR tube
Spectrometer: Bruker Avance 300
Sample head: 10 mm $^1$H/$^{13}$C/$^{15}$N/$^{29}$Si glassfree QNP-Head (Bruker)
Measurement parameter: Pulprog=zgig60, TD=64 k, NS=1024, SW=200 ppm, AQ=2.75 s, =4 s, SF01=300.13 MHz, 01=−50 ppm
Processing-Parameter: SI=64 k, WDW=EM, LB=0.3 Hz
Viscosity:

Viscosity data is measured with a rheometer model MCR302 manufactured by the company Anton Paar, D-Ostfildern, according to DIN EN ISO 3219 in rotation with a cone-plate measurement system. Measurements were performed in a range where the samples behavior is newtonian. Viscosity data are given for a temperature of 25° C. and an ambient pressure of 1013 mbar.

Molecular Weight:

Molecular weight is determined as weight average molecular weight Mw and number average molecular Mn by Size Exclusion Chromatography SEC. Polystyrene is used as standard. The detector is a RI detector. THF is used as solvent. Sample concentration is 5 mg/mL.

Synthesis Example 1

700 g (2.91 mole) phenyltriethoxysilane, 61.6 g (0.415 mole) diethoxydimethylsilane and 77.6 g (0.416 mole) 1,3-divinyl-1,1,3,3-tetramethyldisiloxane were mixed in a 2 L round-bottomed flask. 600 g distilled water and 3.00 g 20% hydrochloric acid were added to the solution. The reaction mixture was refluxed for 2 hours. After cooling, 4.50 g 25% sodium hydroxide solution were added and the reaction mixture was refluxed for 1 hour. The homogeneous mixture was neutralized with 2.00 g 20% hydrochloric acid. Ethanol was distilled off at 40° C. under vacuum and 1 L ethylacetate and 50 g sodium chloride were added. The aqueous phase was removed and the organic phase was washed three times with saturated aqueous sodium chloride solution. The organic phase was dried with magnesium sulfate and was filtrated with press filter equipment. After removal of the solvent in vacuum, 470 g of a colorless, highly viscous product were obtained. Weight average molecular weight Mw is 2,546 g/mol. The results of $^{29}$Si NMR are ViMe$_2$SiO$_{1/2}$: 16.6%, Me$_2$SiO$_{2/2}$: 9.7%, Ph(OR)SiO$_{2/2}$: 12.8% and PhSiO$_{3/2}$: 60.9%.

Example 1

75% by weight of the compound from synthesis example 1 as component A, 25% by weight of 1,1,5,5-tetramethyl-3,3-diphenyltrisiloxane as component B were prepared. In addition, relative to 100 parts by weight of the total of components A and B, 0.0002 parts (with respect to Platinum) by weight of Platinum(0)-1,3-divinyl-1,1,3,3,-tetramethyldisiloxane complex as component C, and 4.99 parts by weight of $D^{Vi}_4$ as component D were prepared. Then, from the above components, a curable organopolysiloxane composition according to example 1 was prepared.

Comparative Example 1

OE-7651N available from Dow Corning was employed as comparative example 1.

Examples 2 to 4

The curable organopolysiloxane compositions according to examples 2 to 4 were prepared in the same manner in example 1 except that components A and B were used in an amount as shown in following table 1.

TABLE 1

|  | Component A | Component B |
|---|---|---|
| Example 2 | 80 | 20 |
| Example 3 | 85 | 15 |
| Example 4 | 90 | 10 |

*unit: parts by weight relative to the 100 parts by weight of total of components A and B Examples 5 to 10

The curable organopolysiloxane compositions according to examples 5 to 10 were prepared in the same manner as in example 1 except that component D was used in an amount as shown in following table 2.

Comparative Example 2

The curable organopolysiloxane composition of comparative example 2 was prepared in the same manner as in example 1 except that component D was not used as shown in following table 2.

TABLE 2

|  | Composition D |
|---|---|
| Example 5 | 1 |
| Example 6 | 1.5 |
| Example 7 | 2 |
| Example 8 | 2.5 |
| Example 9 | 3 |
| Example 10 | 4 |
| Comparative Example 2 | 0 |

*unit: parts by weight (relative to the 100 parts by weight of total of components A and B)

[Toughness Test]

Experimental Example 1

For the compositions according to example 1 and comparative example 1, a toughness test was conducted. The result is shown in FIG. 1.

Figure 1:
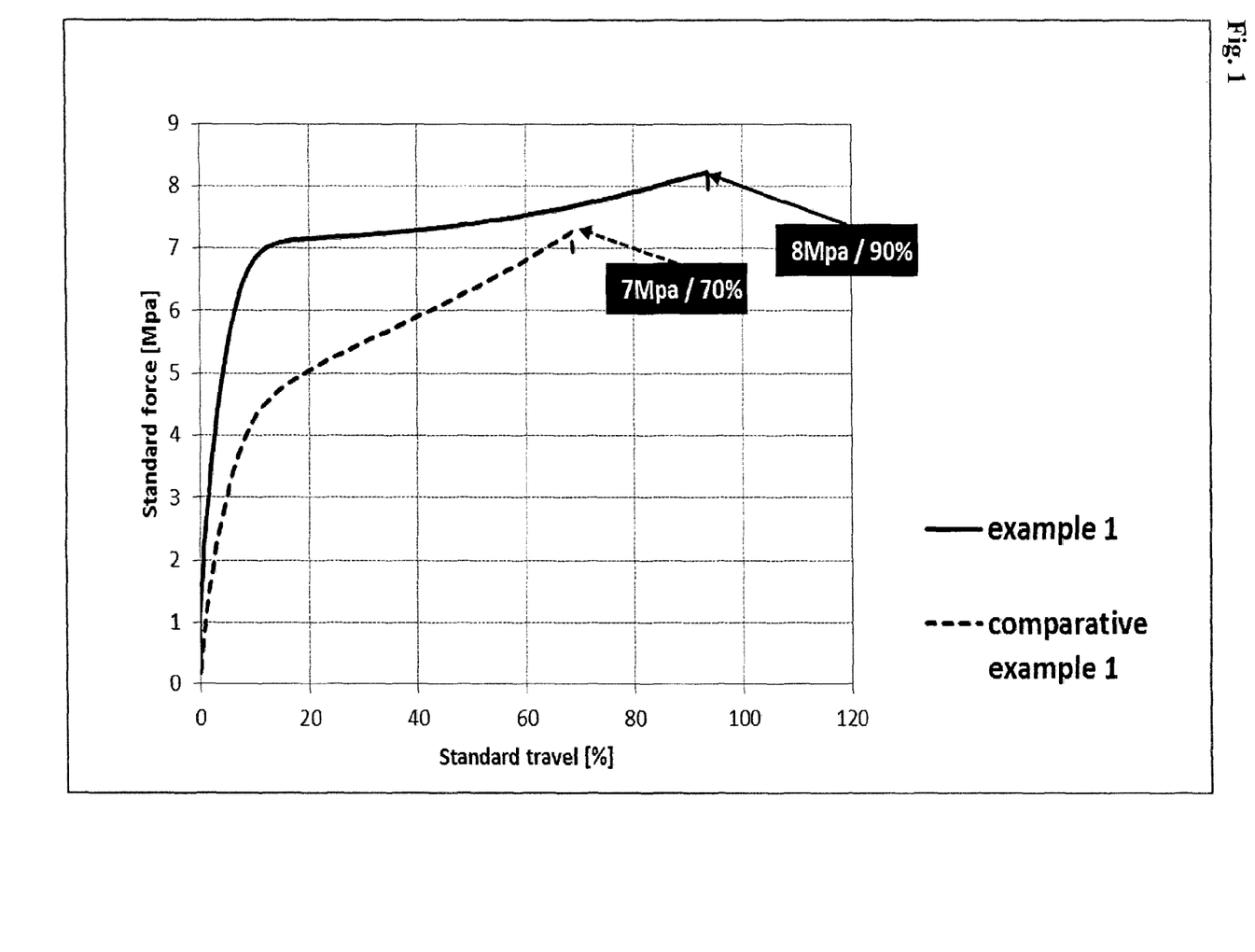
FIGS. 1 and 2 represent a graph showing a result of toughness test.

As shown in FIG. 1, the composition according to example 1 shows high elongation and good tensile strength when compared with the composition according to comparative example 1. It reveals that the composition according to example 1 is tougher and more flexible than the composition according to comparative example 1.

Experimental Example 2

Figure 2:
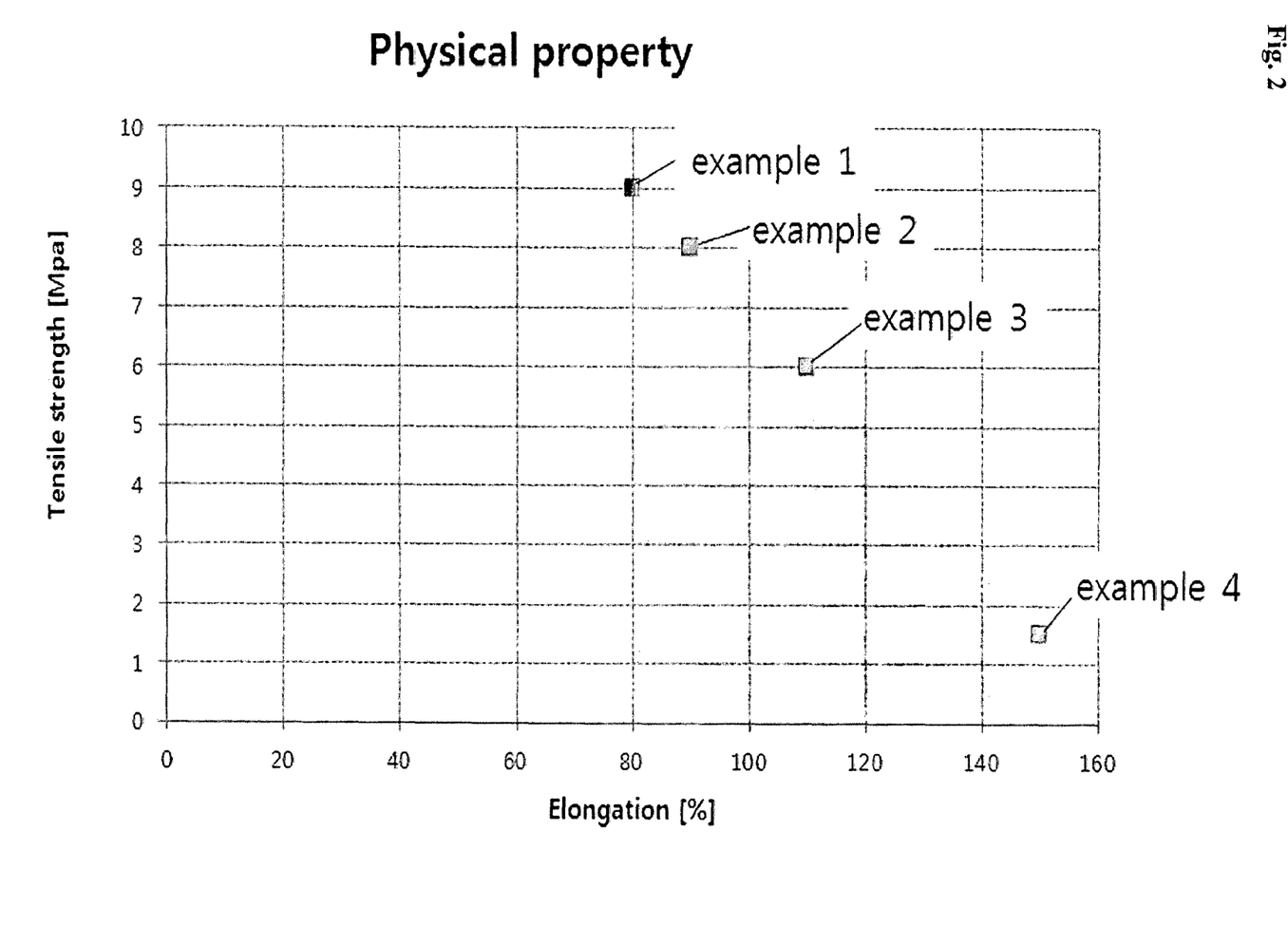

Next, while varying the amount ratio of components A and B as in examples 2 to 4, a toughness test was conducted. The result is shown in following table 3 and FIG. 2.

TABLE 3

|  | Elongation (%) | Tensile Strength (Mpa) |
|---|---|---|
| Example 1 | 80 | 9 |
| Example 2 | 90 | 8 |
| Example 3 | 110 | 6 |
| Example 4 | 150 | 1.5 |

[Sulfur Resistance Test]

Experimental Example 3

For the composition according to example 1 and comparative example 1, sulfur resistance test, K₂S exposure test, was conducted. This test shows the influence of sulfur on the efficiency of a LED.

Water is poured into a vessel, and K₂S is placed on an aluminum pan floating on the water. The initial brightness of a LED package is measured. The LED package is attached to the inner side of the cap of the vessel. Then the cap is closed and the temperature of water raised to 85° C. After several hours, the cap is opened and the brightness of the LED package is measured again. The result is shown in FIG. 3.

Figure 3:
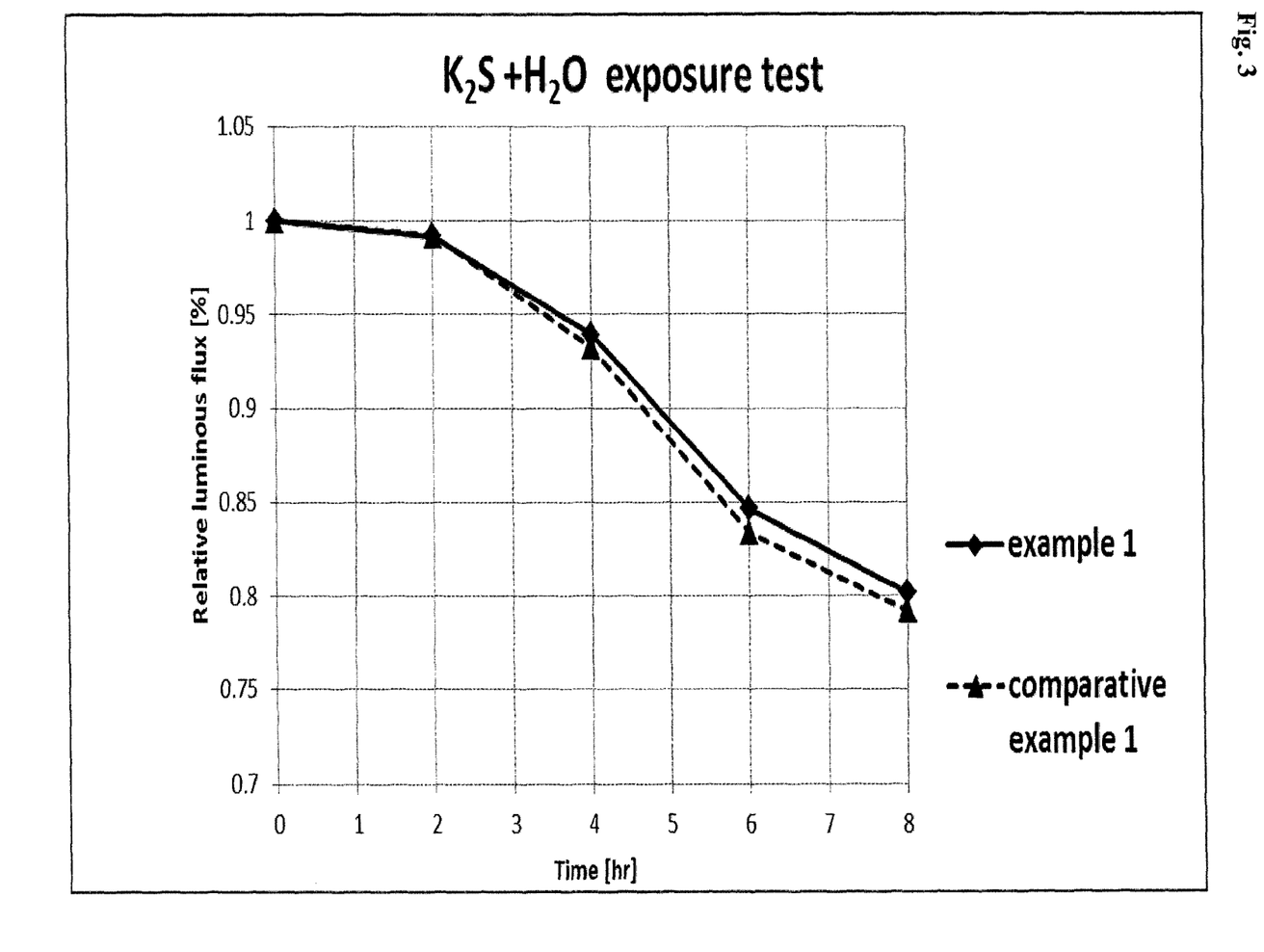
FIG. 3 represents a result of sulfur resistance test.

As shown in FIG. 3, the composition according to example 1 shows good sulfur resistance when compared with the composition according to comparative example 1.

Experimental Example 4

For the composition according to examples 9 and 10 and comparative example 2, sulfur resistance test was also conducted in the same manner as in Experimental Example 3.

The result is shown in following table 4.

TABLE 4

|  |  | Time (hours) | | | | |
|---|---|---|---|---|---|---|
|  |  | 0 | 2 | 4 | 6 | 8 |
| Relative Luminous flux [%] | Example 8 | 100% | 100% | 95% | 87% | 83% |
| | Example 10 | 100% | 100% | 97% | 88% | 84% |
| | Comparative Example 2 | 100% | 100% | 91% | 83% | 80% |

[Thermal Stability Test]

Experimental Example 5

For the composition according to example 1 and comparative example 1, thermal stability test was conducted. Specimens of cured silicone are prepared and stored at 200° C. Transmittance and yellow index of the specimens is measured before and after exposure to high temperature. The result is shown in the FIG. 4.

Figure 4:
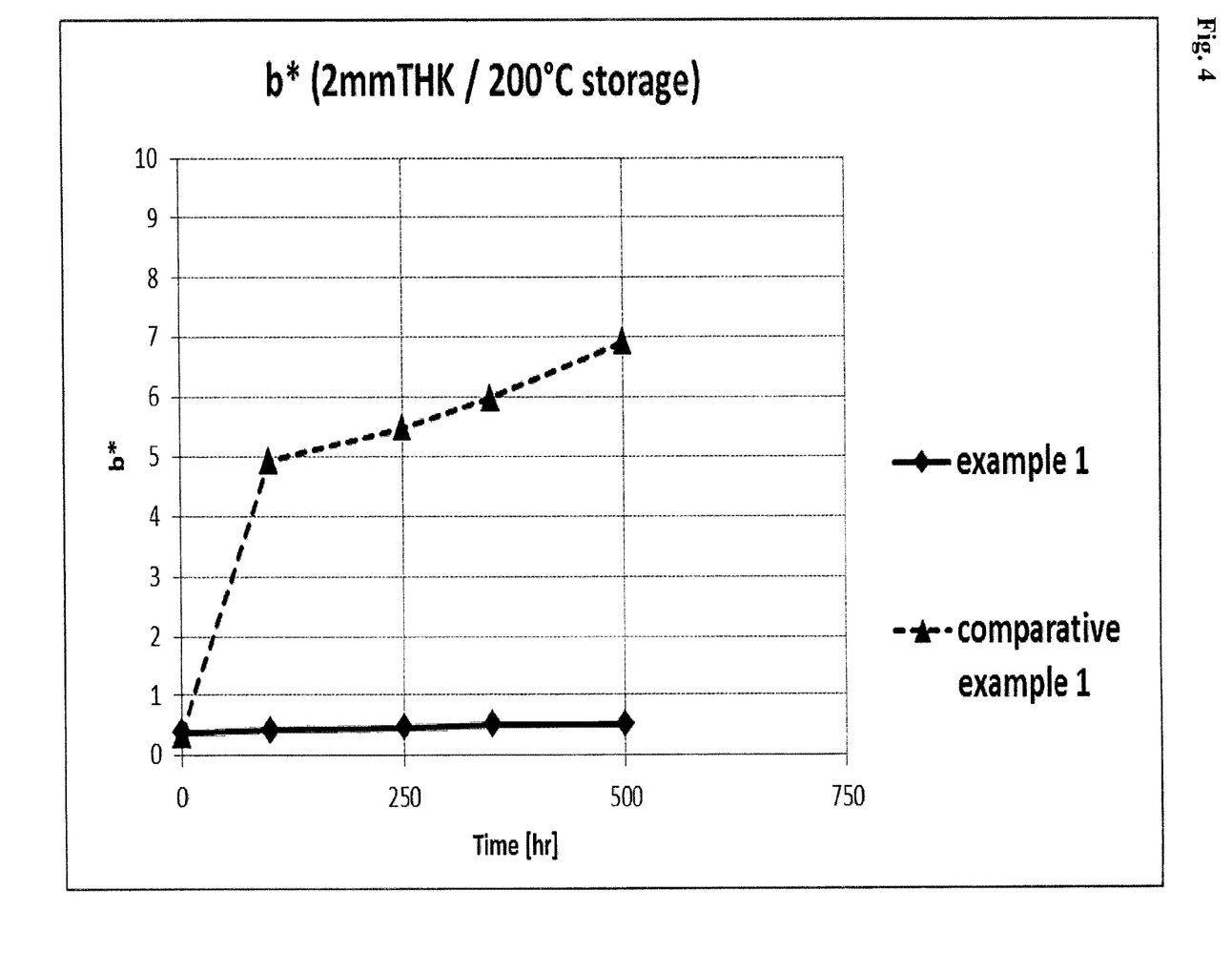
FIG. 4 represents a result of thermal stability test at 200° C.

As shown in FIG. 4, the composition according to example 1 shows no color change at 200° C., whereas the composition according to comparative example 1 shows color change.

Experimental Example 6

Figure 5:
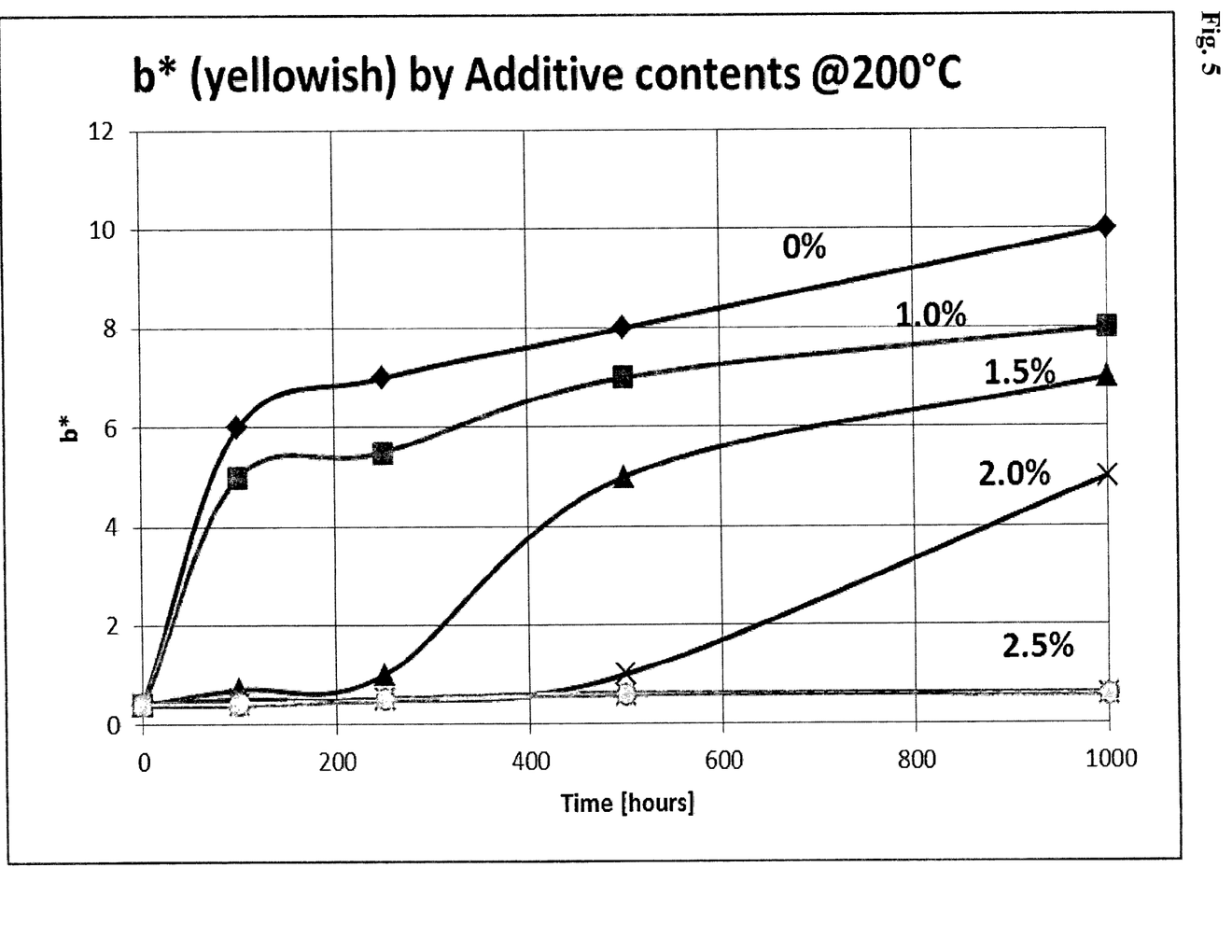
FIGS. 5 and 6 represent a change of hardness and weight at 200° C.

For the composition according to examples 5 to 8 and comparative example 2, thermal stability test was conducted in the same manner as in experimental example 5. The result is shown in the FIG. 5.

[Hardness and Weight Change Test]

Experimental Example 7

For the composition according to example 1 and comparative example 1, change of hardness and weight after storage at 200° C. was determined. Specimens of cured silicone are prepared and stored at 200° C. Then, change of hardness and weight of the specimens were measured. The result is shown in the FIG. 6.

Figure 6:
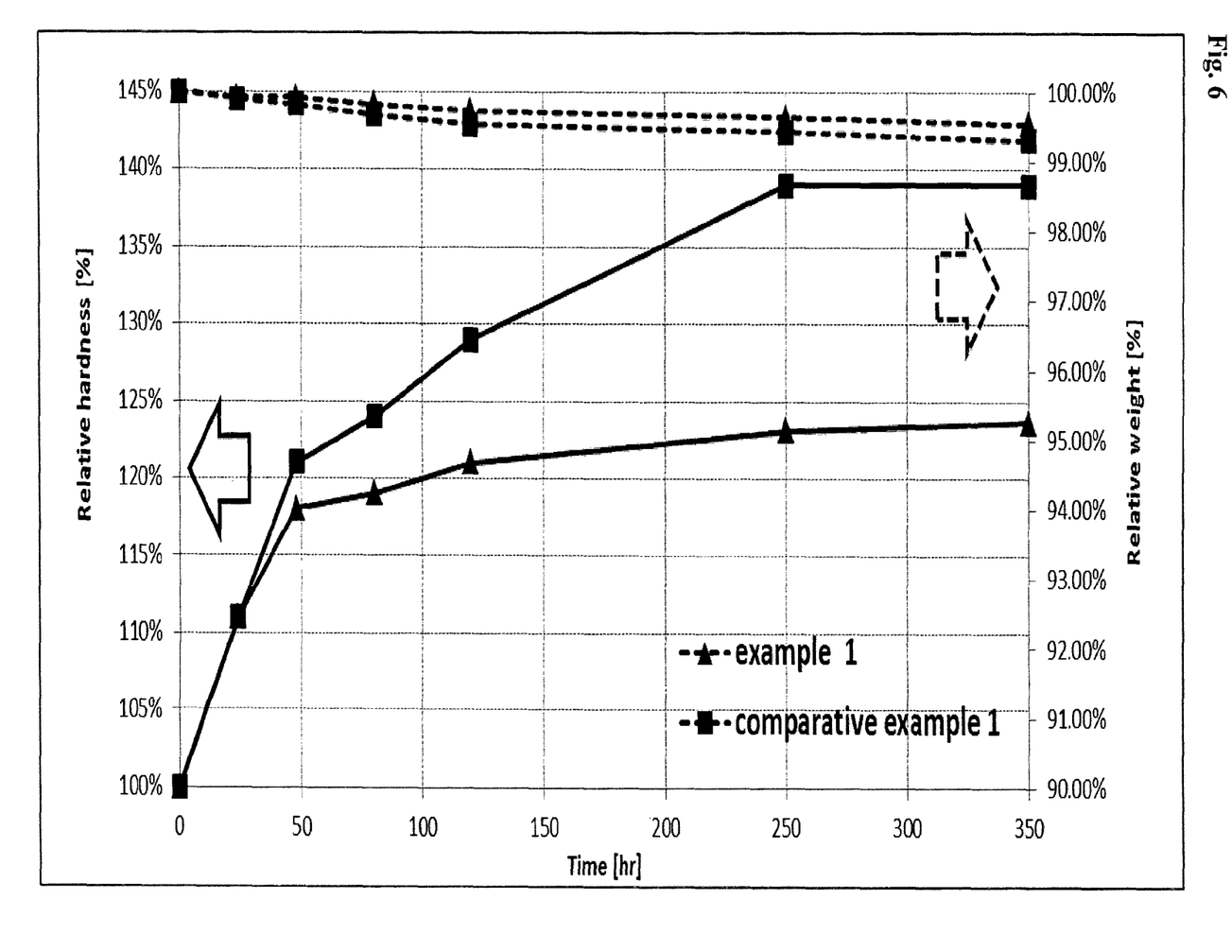

As shown in FIG. 6, the composition according to example 1 shows almost no change of hardness and weight at 200° C., whereas the composition according to comparative example 1 shows increase of hardness and weight.

What is claimed is:

1. A curable organopolysiloxane composition, consisting of:
   (A) a branched organopolysiloxane having at least one silicon-bonded alkenyl group and at least one silicon-bonded aryl group per molecule, and having siloxane units of the formula: $RSiO_{3/2}$ where R is a substituted or unsubstituted monovalent hydrocarbon group;
   (B) a linear organopolysiloxane with both terminal ends of the linear organopolysiloxane bearing silicon-bonded hydrogen atoms and having at least one silicon-bonded aryl group per molecule;
   (C) a hydrosilylation catalyst; and,
   (D) at least 1 parts by weight, relative to 100 parts by weight of the total of components (A) and (B), of a low molecular weight siloxane selected from the group consisting of $D^{\nu_1}_4$, $M^{\nu_1}_4Q$, $M^{\nu_1}_6Q_2$, $M^{\nu_1}_3T$, and mixtures thereof, and
   optionally, a crosslinking agent, a phosphor, an inorganic or organic filler, a heat stabilizer, a dye, a pigment, a flame retardant, or a solvent, or a mixture of one or more of these optional ingredients,
   wherein the curable organopolysiloxane composition does not comprise a linear organopolysiloxane having at least two silicon-bonded alkenyl groups and at least one silicon-bonded aryl group per molecule,
   wherein the weight ratio of component (A) to component (B) is 70:30 to 90:10.

2. The curable organopolysiloxane composition of claim 1, wherein component (A) is an organopolysiloxane of the average unit formula:

$(R^1R^1R^3SiO_{1/2})_a(R^1_2SiO_{2/2})_b(R^2SiO_{3/2})_c(SiO_{4/2})_d(XO_{1/2})_e$ where each of $R^1$, $R^2$, and $R^3$ is the same or different, and is independently selected from substituted or unsubstituted monovalent hydrocarbon group, wherein at least one of $R^1$, $R^2$, or $R^3$ per molecule is an alkenyl groups and at least one of $R^1$, $R^2$, or $R^3$ per molecule is an aryl group, X is a hydrogen atom or an alkyl group, a is 0 or a positive number, b is 0 or a positive number, c is a positive number, d is 0 or a positive number, e is 0 or a positive number, b/c is a number between 0 and 10, a/c is a number between 0 and 0.5,
d/(a+b+c+d) is a number between 0 and 0.3, and
e/(a+b+c+d) is a number between 0 and 0.4.

3. The curable organopolysiloxane composition of claim 1, wherein in which component (A) is an organopolysiloxane with the average unit formula:

where $R^1$ is a $C_1$ to $C_{12}$ alkyl group,
$R^2$ is a $C_6$ to $C_{20}$ aryl group or $C_7$ to $C_{20}$ aralkyl group,
$R^3$ is $C_2$ to $C_{12}$ alkenyl group,
a is 0 or a positive number,
b is 0 or a positive number, and
c is a positive number.

4. The curable organopolysiloxane composition of claim 1, wherein component (B) is an organopolysiloxane of the formula:

[Formula 2]

where each $R^4$ is the same or different and is independently selected from a hydrogen atom or a substituted or unsubstituted monovalent hydrocarbon group with the exception of alkenyl groups, wherein at least one $R^4$ per molecule is an aryl group, and n is an integer of 0 or more.

5. The curable organopolysiloxane composition of claim 1, wherein component (D) comprises $D^{Vi}_4$.

6. The curable organopolysiloxane composition of claim 1, wherein the weight ratio of component (A) to component (B) is 75:25 to 85:15.

7. The curable organopolysiloxane composition of claim 1, wherein component (D) is present in an amount of at most 10 parts by weight, relative to 100 parts by weight of the total of components (A) and (B).

8. The curable organopolysiloxane composition of claim 1, wherein the molar ratio of the hydrosilyl group in component (B) with respect to the alkenyl group in component (A) is 1 to 1.2.

9. The curable organopolysiloxane composition of claim 1, further comprising a crosslinking agent.

10. An LED encapsulant comprising the curable organopolysiloxane composition of claim 1.

11. A semiconductor device, in which semiconductor elements are coated with the cured product of the curable organopolysiloxane composition of claim 1.

12. The semiconductor device of claim 11, wherein the semiconductor elements are light-emitting elements.

13. The curable organopolysiloxane composition of claim 1, wherein component (D) is present in an amount of from 2 to 4 parts by weight relative to 100 parts by weight of components (A) and (B).

* * * * *